(12) United States Patent
Hsin et al.

(10) Patent No.: US 8,481,343 B2
(45) Date of Patent: Jul. 9, 2013

(54) MANUFACTURING METHOD OF MOLDED IMAGE SENSOR PACKAGING STRUCTURE WITH PREDETERMINED FOCAL LENGTH AND THE STRUCTURE USING THE SAME

(75) Inventors: Chung-Hsien Hsin, Hsin-Chu Hsien (TW); Hsiu-Wen Tu, Hsin-Chu Hsien (TW); Chun-Hua Chuang, Hsin-Chu Hsien (TW); Ren-Long Kuo, Hsin-Chu Hsien (TW); Chin-Fu Lin, Hsin-Chu Hsien (TW); Young-Houng Shiao, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 276 days.

(21) Appl. No.: 12/961,521

(22) Filed: Dec. 7, 2010

(65) Prior Publication Data

US 2012/0068288 A1 Mar. 22, 2012

(30) Foreign Application Priority Data

Sep. 17, 2010 (TW) .............................. 99131676 A

(51) Int. Cl.
*H01L 21/00* (2006.01)
*H01L 21/66* (2006.01)
*G01R 31/26* (2006.01)
*B29C 43/22* (2006.01)

(52) U.S. Cl.
USPC 438/14; 438/26; 257/E31.117; 257/E31.127; 264/272.17

(58) Field of Classification Search
USPC ............. 257/432, E31.127, E31.117; 438/14, 438/26; 264/272.17
See application file for complete search history.

(56) References Cited

U.S. PATENT DOCUMENTS

| | | | |
|---|---|---|---|
| 2009/0134481 A1* | 5/2009 | Sengupta | 257/415 |
| 2010/0182483 A1 | 7/2010 | Majima | |
| 2011/0000292 A1 | 1/2011 | Yoshikawa et al. | |
| 2011/0096219 A1* | 4/2011 | Lee et al. | 348/308 |

FOREIGN PATENT DOCUMENTS

| EP | 2 341 541 A2 | 7/2011 |
|---|---|---|
| WO | WO 2008/126549 A1 | 10/2008 |

* cited by examiner

*Primary Examiner* — David S Blum
(74) *Attorney, Agent, or Firm* — Stites & Harbison PLLC; Juan Carlos A. Marquez, Esq.

(57) ABSTRACT

A manufacturing method of a molded image sensor packaging structure with a predetermined focal length and the structure using the same are disclosed. The manufacturing method includes: providing a substrate; providing a sensor chip disposed on the substrate; providing a lens module set over the sensing area of the chip to form a semi-finished component; providing a mold that has an upper mold member with a buffer layer; disposing the semi-finished component into the mold to form a mold cavity therebetween; injecting a molding compound into the mold cavity; and after transfer molding the molding compound, opening the mold and performing a post mold cure process to cure the molding compound. The buffer layer can fill the air gap between the upper surface of the lens module and the upper mold member, thereby preventing the upper surface of the lens module from being polluted by the molding compound.

7 Claims, 7 Drawing Sheets

MANUFACTURING METHOD OF MOLDED IMAGE SENSOR PACKAGING STRUCTURE WITH PREDETERMINED FOCAL LENGTH AND THE STRUCTURE USING THE SAME

BACKGROUND OF THE INVENTION

1. Technical Field

The present invention relates to image sensor packaging structures and manufacturing methods thereof. More particularly, the present invention discloses a molded image sensor packaging structure having a lens module with a predetermined focal length and a manufacturing method thereof.

2. Description of Related Art

Image sensors have been widely used in various digital image products as a component that receives light and converts optical signals into electrical signals. With the popularization of diverse digital image products, the demand for image sensors is increasingly growing. Thus, for meeting the requirements of simplifying the packaging process of electronic products and downsizing the packaging structure of image sensors, the manufacturers have all spent efforts to make improvements in the packaging process and packaging structure.

Packaging is provided for preventing the image sensor module form being damaged by external force or environmental factors, and for providing electrical connection between the image sensor module and the exterior environment, so as to secure transmission of signals therebetween.

However, the existing packaging structures still have challenges to be overcome, for example:

1. The problem related to space: in the existing COB (Chip On Board) packaging approach, a relatively large space is required for accommodating metal leading wires. In addition, since the conventional COB packaging approach is accomplished by adhering an image sensing chip on a substrate or circuit board, the overall height is increased by the thickness of the substrate or circuit board and hard to be reduced. In order to solve the problem that wiring consumes space in COB packaging, chip-size packaging plus wafer-level optics (CSP+WLO) has been used with a lens module. However, in such an approach, an additional piece of optical glass has to be set between the image sensing chip and the wafer-level optics, so the overall height is subject to the required focal length and hard to be reduced. Moreover, COB packaging needs additional substrates or circuit boards. However, because of the shortage and the consequent price hike of the global resources, the manufacturing cost would be increased.

2. The problem related to lateral leakage: the existing packaging methods are all subject to lateral leakage and need additional lens hoods or lateral light-blocking coating. The additional lens hoods and coating can not only increase material costs but also complicate the manufacturing process.

3. The need of focusing: in the traditional packaging process, a focusing mechanism is required for focusing, so as to achieve the optical definition. This work needs special devices and processes, and thus causes increased costs.

4. Leakage of the molding compound over the upper surface of the lens module: in molding and packaging processes, since the mold and the lens module are both made of rigid materials, when the upper mold member of the mold directly presses upon the lens module, the lens module is likely to be damaged under compression, thus reducing the yield of the image sensor packaging structure. Furthermore, since tiny gaps exist between the upper mold member and the upper surface of the lens module, when a molding compound is filled into the mold cavity, the molding compound tends to leak over the upper surface of the lens module under capillarity, thereby adversely affecting the image sensing effect of the image sensor packaging structure.

SUMMARY OF THE INVENTION

The present invention relates to a manufacturing method of a molded image sensor packaging structure and the structure using the same. In molding, due to a buffer layer provided on an upper mold member of a mold to be contacted by the lens module, gaps between the upper mold member and upper surface of the lens module can be eliminated, so as to prevent the molding compound from leaking over the upper surface of the lens module.

To achieve the above effect, the present invention provides a manufacturing method of a molded image sensor packaging structure. The manufacturing method comprises steps of: providing a substrate, wherein the substrate comprises a bearing surface and a bottom surface, and the bearing surface is formed with a plurality of first conductive contacts thereon; providing a chip, wherein the chip comprises: a first surface bonded to the bearing surface; a second surface having a sensing area; and a plurality of second conductive contacts that are arranged around the sensing area and each electrically connected to a respective said first conductive contact through a metal leading wire; providing a lens module that is deposited on the second surface over the sensing area to form an air chamber and has a predetermined focal length, wherein the substrate, the chip and the lens module form a semi-finished component; providing a mold, wherein the mold comprises an upper mold member and a lower mold member, and the upper mold member has a buffer layer; disposing the semi-finished component into the mold to form a mold cavity therebetween, wherein the buffer layer abuts against an upper surface of the lens module and the lower mold member abuts against the bottom surface of the substrate; injecting a molding compound into the mold cavity, so that the molding compound covers a periphery of the semi-finished component but leaves the upper surface of the lens module uncovered; and after transfer molding the molding compound, opening the mold and performing a post mold cure process to cure the molding compound.

To achieve the above effect, the present invention provides a molded image sensor packaging structure. The molded image sensor packaging structure comprises: a substrate, having a bearing surface and a bottom surface, with the bearing surface formed with a plurality of first conductive contacts; a chip, having: a first surface bonded to the bearing surface; a second surface having a sensing area; and a plurality of second conductive contacts that is arranged around the sensing area and each electrically connected to a respective said first conductive contact through a metal leading wire; a lens module that is deposited on the second surface over the sensing area to form an air chamber, and has a predetermined focal length, wherein the substrate, the chip and the lens module form a semi-finished component; and a molding compound molded to cover a periphery of the semi-finished component but leave an upper surface of the lens module uncovered.

By implementing the present invention, at least the following progressive effects can be achieved:

1. By providing the buffer layer on the upper mold member of the mold, the close contact between the buffer layer and the upper surface of the lens module prevents the packaging compound from leaking over the upper surface of the lens module.

2. The yield of the image sensor packaging structure can be improved while the image sensing effect is maintained.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
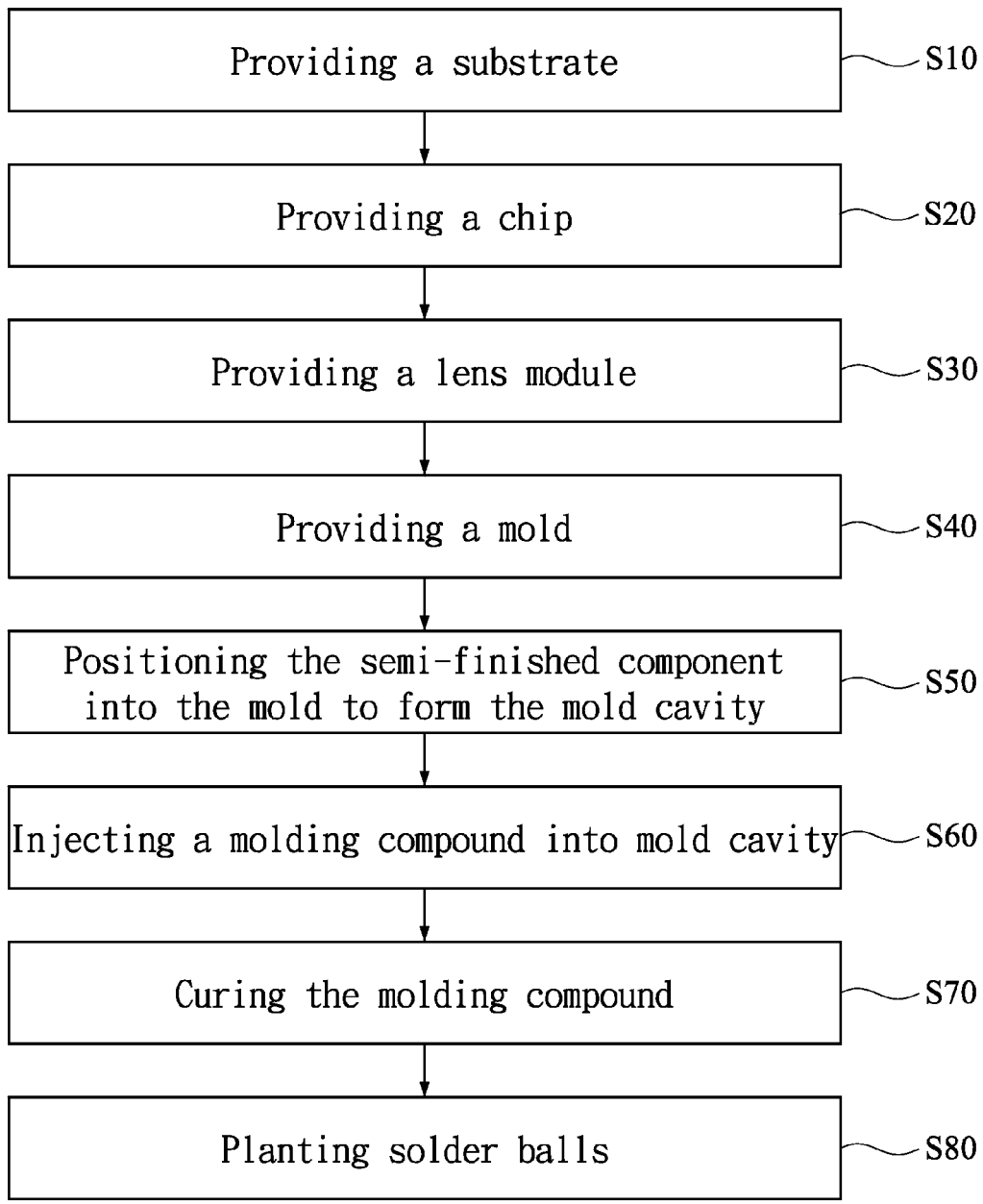
FIG. 1 is a flowchart of a manufacturing method of a molded image sensor packaging structure according to one embodiment of the present invention.

As shown in FIG. 1, the present embodiment is a manufacturing method of a molded image sensor packaging structure. The manufacturing method comprises the following steps: providing a substrate (S10); providing a chip (S20); providing a lens module (S30); providing a mold (S40); positioning the semi-finished component into the mold to form a mold cavity between the semi-finished component and the mold (S50); injecting a molding compound into the mold cavity (S60); and curing the molding compound (S70).

Figure 2A:
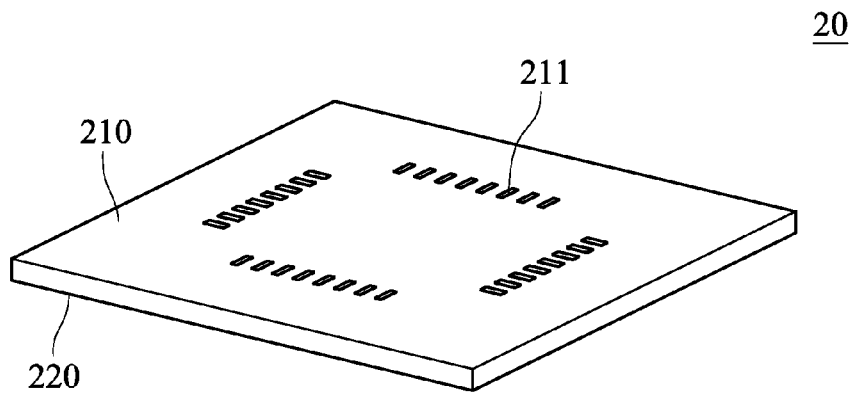
FIG. 2A through FIG. 2F are schematic drawings illustrating the manufacturing method of the molded image sensor packaging structure according to the embodiment of the present invention.
Figure 3A:
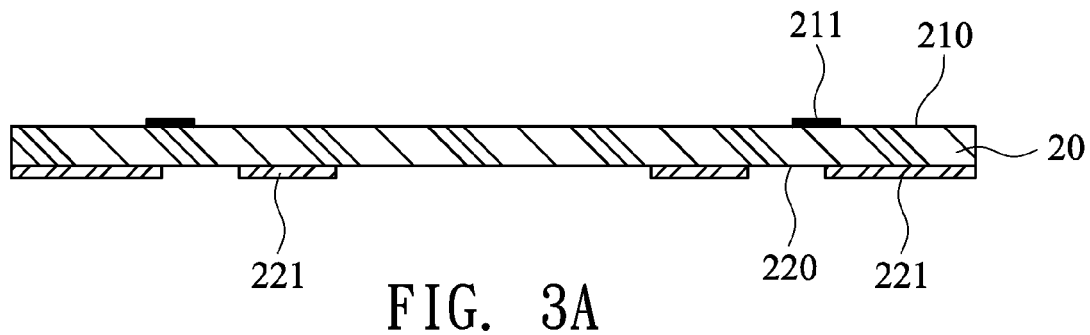
FIG. 3A is a lateral view of a substrate according to one embodiment of the present invention.
Figure 3B:
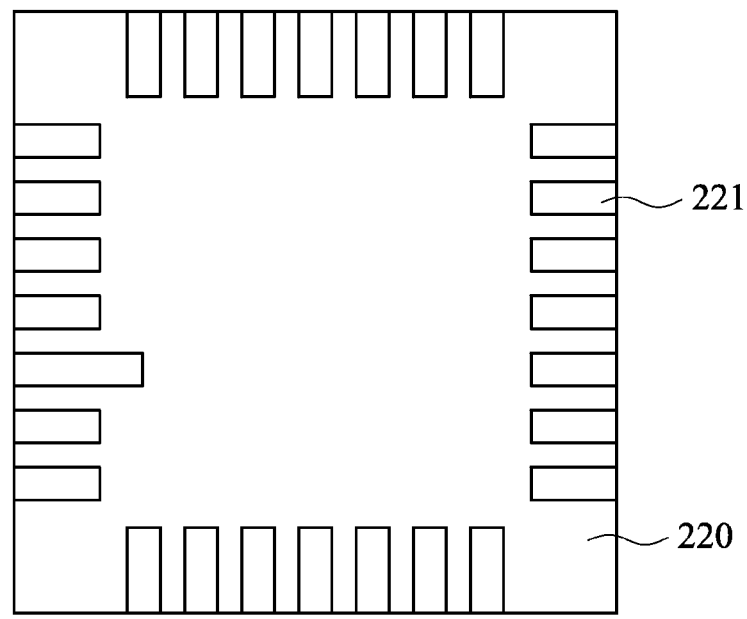
FIG. 3B and FIG. 3C are schematic drawings of a bottom surface of the substrate according to different embodiments of the present invention.
Figure 3C:
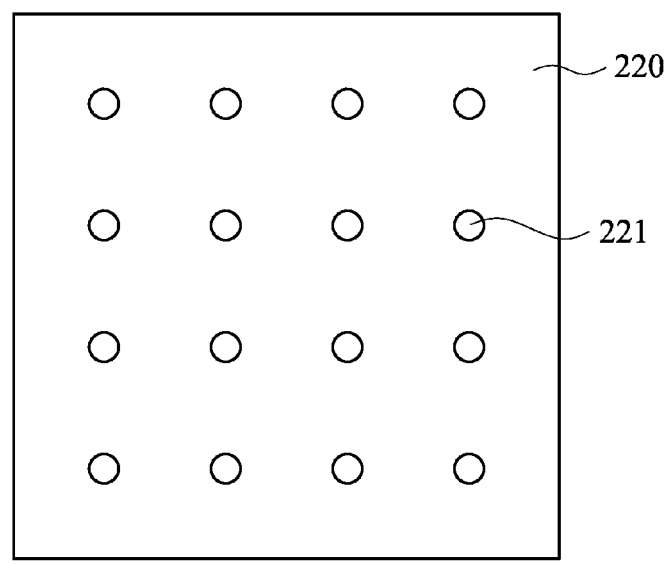

In the step of providing a substrate (S10), as shown in FIG. 2A, a substrate 20 comprises a bearing surface 210 and a bottom surface 220. The bearing surface 210 is formed with a plurality of first conductive contacts 211. As shown in FIG. 3A, the bottom surface 220 of the substrate 20 has a plurality of solder pads 221. The solder pads 221 are electrically connected to the first conductive contacts 211 on the bearing surface 210 through a circuit (not shown) in the substrate 20. Also referring to FIG. 3B and FIG. 3C, the solder pads 221 are arranged along a periphery of the bottom surface 220 of the substrate 20 or arranged as an array on the bottom surface 220 of the substrate 20.

Figure 2B:
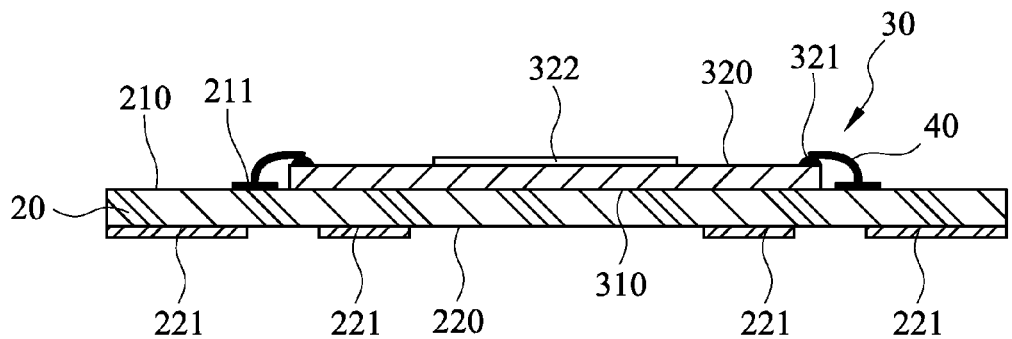

In the step of providing a chip (S20), as shown in FIG. 2B, a chip 30 is positioned on the substrate 20. The chip 30 may be a complementary metal-oxide-semiconductor image sensing chip or a charge-coupled device. Therein, the chip 30 comprises: a first surface 310; a second surface 320; and a plurality of second conductive contacts 321. The chip 30 has the first surface 310 bonded to the bearing surface 210 of the substrate 20. The second surface 320 of the chip 30 has a sensing area 322 that is peripherally circled by the second conductive contacts 321. Therein, each of the second conductive contacts 321 is electrically connected to a respective said first conductive contact 211 on the substrate 20 through a metal leading wire 40.

Figure 2C:
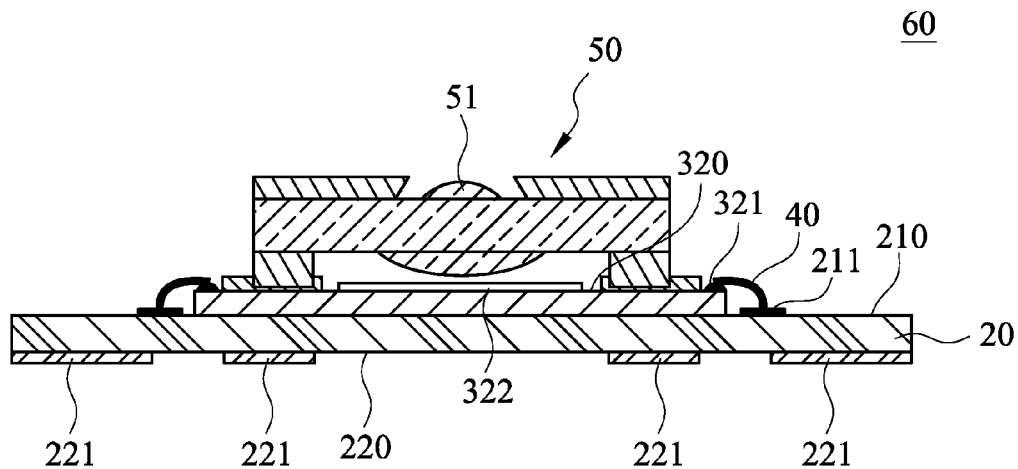

In the step of providing a lens module (S30), as shown in FIG. 2C, a lens module 50 is set on the second surface 320 over the sensing area 322 to form an air chamber in cooperation with the chip 30. Therein, the lens module 50 has a predetermined focal length and is an optical assembly preassembled and pretested. Since the lens module 50 has the predetermined focal length, an additional step of readjusting the focal length of the lens module 50 can be eliminated, thereby simplifying the manufacturing process.

As shown in FIG. 2C, the substrate 20, the chip 30 and the lens module 50, when assembled together, form a semi-finished component 60.

Figure 2D:
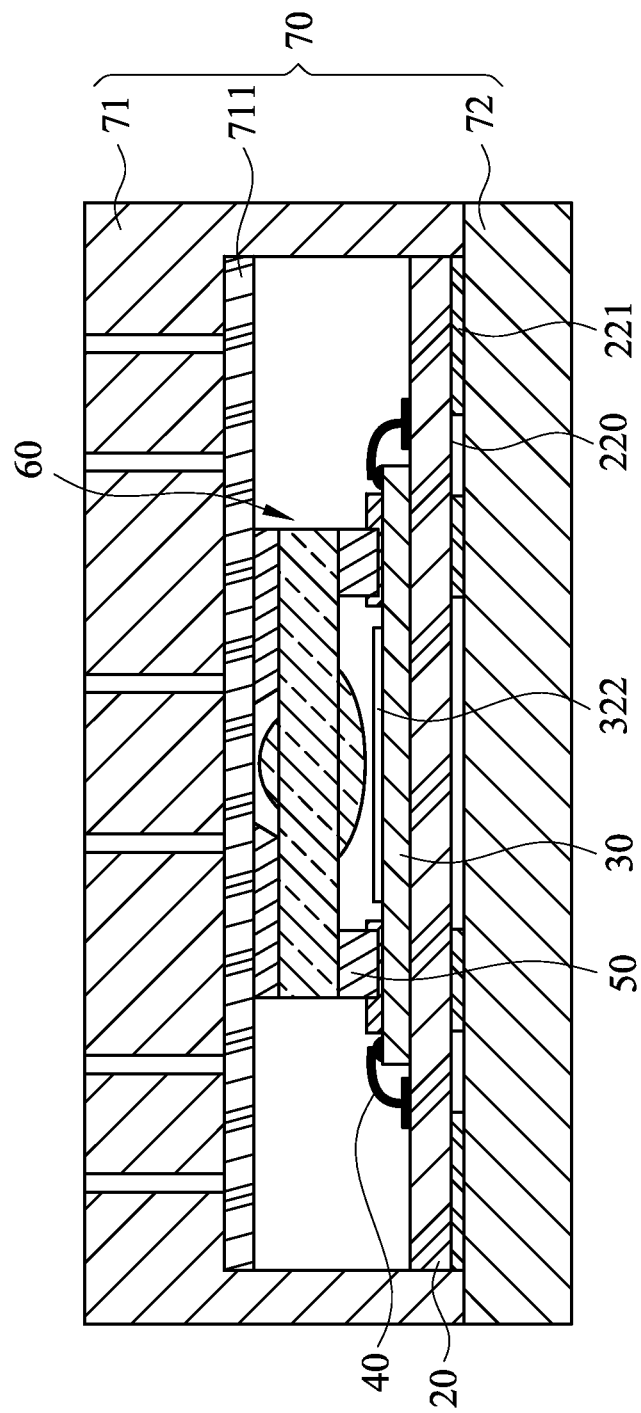

In the step of providing a mold (S40), as shown in FIG. 2D, a mold 70 comprises an upper mold member 71 and a lower mold member 72. The upper mold member 71 has a buffer layer 711 at a surface thereof to be contacted with the lens module 50.

In the step of positioning the semi-finished component into the mold to form a mold cavity therebetween (S50), as shown in FIG. 2D, by positioning the semi-finished component 60 into the mold 70, a mold cavity is formed between the semi-finished component 60 and the mold 70. Therein, the buffer layer 711 on the upper mold member 71 abuts against an upper surface of the lens module 50 while the lower mold member 72 abuts against and props the bottom surface 220 of the substrate 20.

Figure 2E:
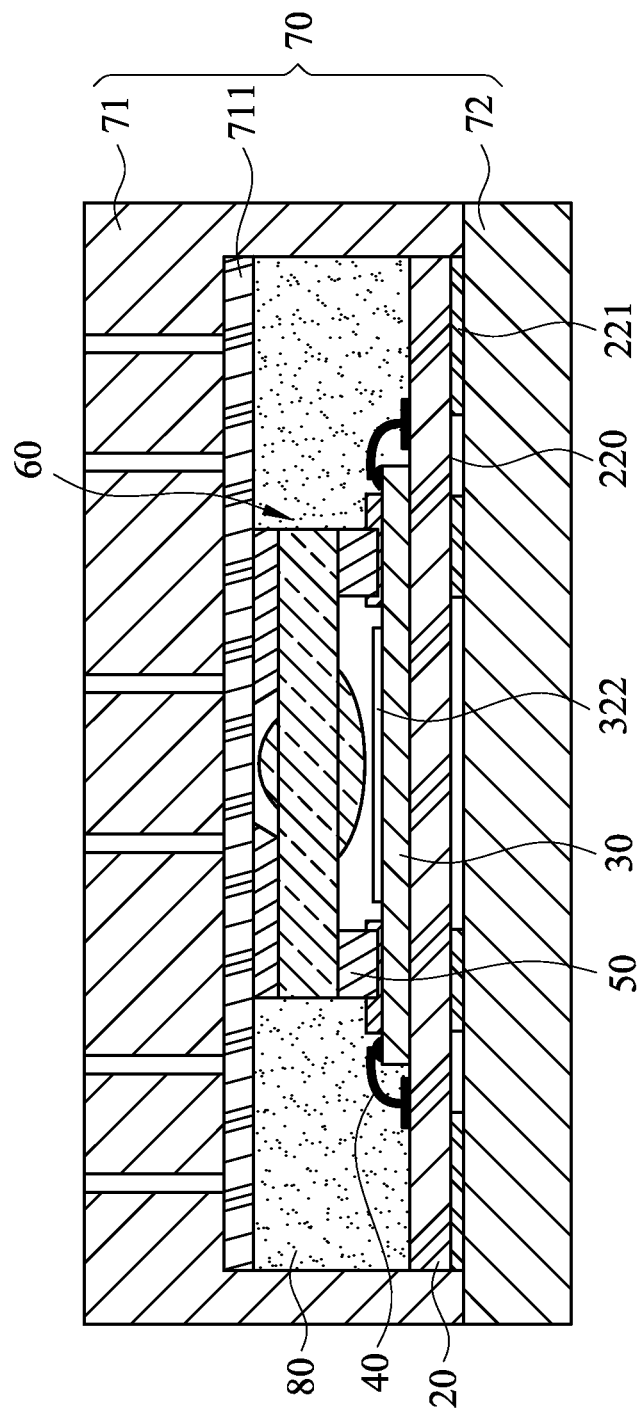

In the step of injecting a molding compound into the mold cavity (S60), as shown in FIG. 2E, a molding compound 80 is to be injected into the mold cavity, so as to make the molding compound 80 cover a periphery of the semi-finished component 60 but leave the upper surface of the lens module 50 uncovered. Therein, at the time of injecting the molding compound 80, the buffer layer 711 levelly affixes to the upper mold member 71 at its surface in virtue of vacuum suction. In addition, since the buffer layer 711 is elastic and may be made of a flexible material (such as thermoplastic or fluoropolymers), gaps between the upper mold member 71 and the lens module 50 can be fully sealed by the buffer layer 711.

Therefore, when the molding compound 80 is injected into the mold cavity, gaps between the upper surface of the lens module 50 and the upper mold member 71 can be completely eliminated, so as to prevent the molding compound 80 from leaking over the upper surface of the lens module 50, thereby increasing the yield of the image sensor packaging structure. Furthermore, when the upper mold member 71 and the lower mold member 72 are closed, the molding pressure may help to level the molding compound 80 and reduce relative inclination between the lens module 50 and the chip 30, so as to effectively maintain the focus of the lens module 50 right on the sensing area 322 of the chip 30.

Moreover, for preventing light from entering through laterals of the lens module 50 to diversely affect the image sensing effect of the chip 30, the molding compound 80 may be a low-transmittance encapsulant, or even a black encapsulant.

Figure 2F:
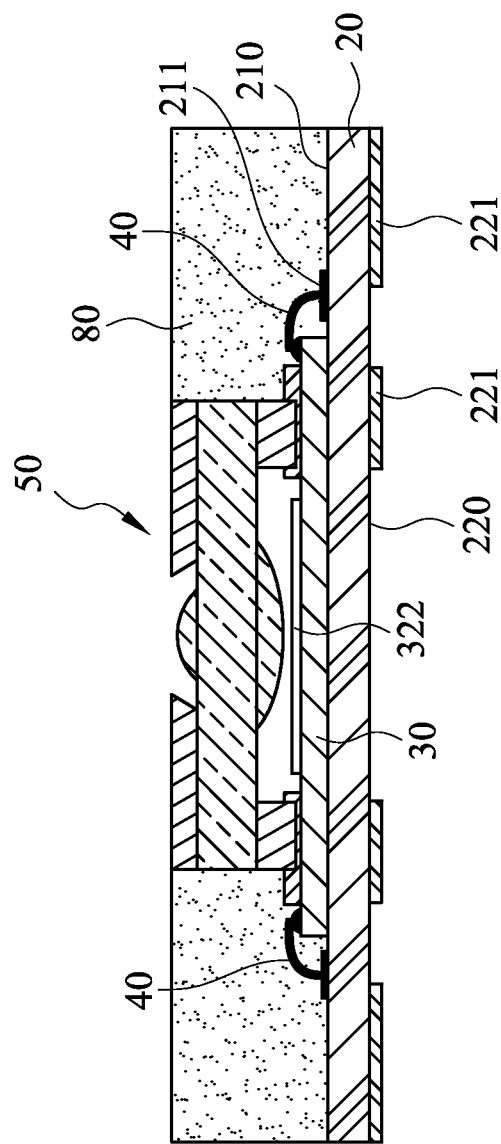

In the step of curing the molding compound (S70), referring to FIG. 2F as well, after the upper mold member 71 and the lower mold member 72 are closed to allow transfer molding of the molding compound 80, the mold is opened and a post mold cure process is performed to cure the molding compound 80. Thereby, the molded image sensor packaging structure is finished.

Figure 4:
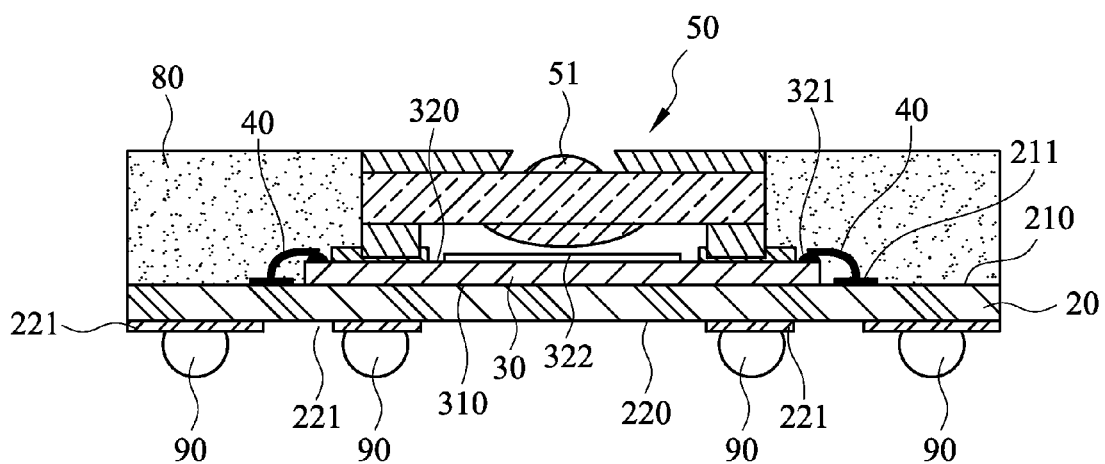
FIG. 4 is a schematic view of a molded image sensor packaging structure according to one embodiment of the present invention.

Referring back to FIG. 1, after the molding compound 80 is cured, a step of planting solder balls (S80) may be further performed. As shown in FIG. 4, through the step of planting solder balls, a plurality of solder balls 90 are provided on the bottom surface 220 of the substrate 20, and the solder balls 90 are electrically connected to the solder pads 221, respectively, so that the chip 30 can be electrically connected to an external device through a route formed by the second conductive contacts 321, the metal leading wires 40, the first conductive contacts 211, the circuit in the substrate 20, the solder pads 221 and the solder balls 90. Therein, when the solder pads 221 are arranged as an array, the solder balls 90 are also arranged into a ball array (not shown).

Thus, as shown in FIG. 4, a molded image sensor packaging structure made by using the foregoing manufacturing method comprises: a substrate 20; a chip 30; a lens module 50; a molding compound 80; and a plurality of solder balls 90.

Therein, substrate 20 has a bearing surface 210 and a bottom surface 220. The bearing surface 210 is formed with a plurality of first conductive contacts 211 and the bottom surface 220 has a plurality of solder pads 221. The solder pads 221 are electrically connected to the first conductive contacts 211 through a circuit in the substrate 20.

The chip 30 has a first surface 310 bonded to the bearing surface 210 of the substrate 20, so that the chip 30 is fixed to the substrate 20. The chip 30 has a second surface 320 provided with a sensing area 322. The sensing area 322 is peripherally circled by a plurality of second conductive contacts 321, and is electrically connected to the second conductive contacts 321 and the first conductive contacts 211 through metal leading wires 40 so that the chip 30 and the substrate 20 are electrically connected.

The lens module 50 comprises a plurality of lenses 51. The lens module 50 has its focus preset and pretested during its manufacturing, so that the lens module 50 has a predetermined focal length. Since the lens module 50 is preassembled and pretested, the manufacturing process of the image sensor packaging structure can be simplified.

The lens module 50 has its lower surface adhered to the second surface 320 of the chip 30 and covers the sensing area 322, so that the lens module 50 is positioned above the sensing area 322 and forms an air chamber in cooperation with the chip 30. In addition, the substrate 20, the chip 30 and the lens module 50, when assembled, can be jointly defined as a semi-finished component 60 to be packaged.

The molding compound 80 is molded through the foregoing manufacturing method to cover a periphery of the semi-finished component 60, so that the molding compound 80 covers the bearing surface 210 of the substrate 20 and wraps the metal leading wires 40 and peripheries of the chip 30 and the lens module 50, most important, without covering the upper surface of the lens module 50.

The solder balls 90 are arranged on the solder pads 221 on the bottom surface 220 of the substrate 20 so as to be electrically connected to the solder pads 221. Thereby, the substrate 20 is electrically connected to an external device through the solder balls 90.

The molded image sensor packaging structure and the manufacturing method as described in the embodiments are applicable to a leadless chip carrier (LCC), a land grid array (LGA) and a ball grid array (BGA). Additionally, by providing the buffer layer 711 at the surface of the upper mold member 71 to be contacted by the semi-finished component 60 to be packaged, and by using vacuum suction while injecting the molding compound 80 to make the buffer layer 711 levelly affix to the surface of the upper mold member 71 and to thereby eliminate gaps between the upper surface of the lens module 50 in the semi-finished component 60 and the upper mold member 71, not only can the molded molding compound 80 be leveled, but also can the molding compound 80 be prevented from leaking over the upper surface of the lens module 50, so as to increase the yield of the image sensor packaging structure.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A manufacturing method of a molded image sensor packaging structure, the manufacturing method comprising steps of:
   providing a substrate, wherein the substrate comprises a bearing surface and a bottom surface, and the bearing surface is formed with a plurality of first conductive contacts;
   providing a chip to be positioned on the substrate, wherein the chip comprises a first surface bonded to the bearing surface, a second surface having a sensing area, and a plurality of second conductive contacts arranged around the sensing area and each electrically connected to a respective said first conductive contact through a metal leading wire;
   providing a lens module to be set on the chip, wherein the lens module is set on the second surface over the sensing area so as to form an air chamber above the sensing area, and has a predetermined focal length, in which the substrate, the chip and the lens module form a semi-finished component;
   providing a mold, wherein the mold comprises an upper mold member and a lower mold member, and the upper mold member is provided with a buffer layer, which is made of elastic material;
   positioning the semi-finished component into the mold to form a mold cavity between the semi-finished component and the mold, wherein the buffer layer abuts against an upper surface of the lens module and the lower mold member abuts against the bottom surface of the substrate;
   injecting a molding compound into the mold cavity, so as to make the molding compound cover the periphery of the semi-finished component but leave the upper surface of the lens module uncovered, wherein the buffer layer affixes to the upper mold member and forms level at a surface of the upper mold member via vacuum suction to eliminate gaps between the upper surface of the lens module and the upper mold member; and
   after transfer molding the molding compound, opening the mold and performing a post mold cure process to cure the molding compound.

2. The manufacturing method of claim 1, wherein the chip is a complementary metal-oxide-semiconductor image sensing chip or a charge-coupled device.

3. The manufacturing method of claim 2, wherein the molding compound is a low-transmittance encapsulant or a black encapsulant.

4. The manufacturing method of claim 3, wherein the bottom surface of the substrate has a plurality of solder pads, and the solder pads are electrically connected to the first conductive contacts through a circuit in the substrate.

5. The manufacturing method of claim 4, wherein the solder pads are arranged along a periphery of the bottom surface of the substrate or are arranged into an array.

6. The manufacturing method of claim 5, wherein the step of curing the molding compound is followed by a step of planting solder balls, in which step a plurality of solder balls are planted on the bottom surface of the substrate, and the solder balls are electrically connected to the solder pads.

7. The manufacturing method of claim 6, wherein when the solder pads are arranged into the array, the solder balls are also arranged into an array.

* * * * *